(12) United States Patent
Kim et al.

(10) Patent No.: US 11,527,096 B2
(45) Date of Patent: Dec. 13, 2022

(54) ELECTRONIC DEVICE AND METHOD OF MEASURING BIOMETRIC INFORMATION USING THE SAME

(71) Applicant: Samsung Display Co., LTD., Yongin-si (KR)

(72) Inventors: Yuna Kim, Seoul (KR); Keumdong Jung, Seoul (KR); Suk Kim, Hwaseong-si (KR); Soojung Lee, Suwon-si (KR); Yun-Ho Kim, Hwaseong-si (KR); Goeun Cha, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 84 days.

(21) Appl. No.: 17/116,935

(22) Filed: Dec. 9, 2020

(65) Prior Publication Data
US 2021/0232793 A1 Jul. 29, 2021

(30) Foreign Application Priority Data
Jan. 29, 2020 (KR) .......................... 10-2020-0010384

(51) Int. Cl.
*G06V 40/13* (2022.01)
*H01L 27/32* (2006.01)
(Continued)

(52) U.S. Cl.
CPC ........ *G06V 40/1318* (2022.01); *G06V 10/141* (2022.01); *G06V 10/145* (2022.01);
(Continued)

(58) Field of Classification Search
CPC ............. G06V 40/1318; G06V 10/141; G06V 10/145; H01L 27/3216; H01L 27/3234;
(Continued)

(56) References Cited

U.S. PATENT DOCUMENTS

| | | | | |
|---|---|---|---|---|
| 2011/0128262 A1* | 6/2011 | Chaji | .................. | H01L 51/5271 313/504 |
| 2013/0113843 A1* | 5/2013 | Yamazaki | ........... | H01L 27/3213 313/505 |

(Continued)

FOREIGN PATENT DOCUMENTS

| | | |
|---|---|---|
| KR | 10-2018-0093628 | 8/2018 |
| KR | 10-2018-0114797 | 10/2018 |

(Continued)

*Primary Examiner* — Abhishek Sarma
(74) *Attorney, Agent, or Firm* — H.C. Park & Associates, PLC

(57) ABSTRACT

Provided is an electronic device measuring user's biometric information. The electronic device includes a display module including a display panel, in which a signal transmission region, a peripheral display region adjacent to the signal transmission region, and a main display region spaced apart from the signal transmission region are provided, and a camera module overlapped with the signal transmission region. The display panel includes a plurality of first pixels, which are disposed in a unit region of the main display region, and a plurality of second pixels, which are disposed in a unit region of the peripheral display region. An emission area of green light in the unit region of the first pixels is different from an emission area of green light in the unit region of the second pixels.

19 Claims, 12 Drawing Sheets

(51) Int. Cl.
*H04N 5/225* (2006.01)
*G06V 10/141* (2022.01)
*G06V 10/145* (2022.01)
*G09G 3/3233* (2016.01)

(52) U.S. Cl.
CPC ....... *H01L 27/3216* (2013.01); *H04N 5/2257* (2013.01); *G09G 3/3233* (2013.01); *G09G 2300/0452* (2013.01); *H01L 27/3234* (2013.01); *H01L 27/3244* (2013.01)

(58) Field of Classification Search
CPC ............. H01L 27/3244; H01L 27/3218; H01L 27/326; H04N 5/2257; H04N 5/2256; H04N 5/2252; G09G 3/3233; G09G 2300/0452; G09G 2300/0426; G09G 2300/0439; G09G 2360/14; G09G 3/20; A61B 5/0261; A61B 5/0059; A61B 5/024; A61B 5/02444; A61B 5/14551; A61B 5/14552; A61B 5/7275
See application file for complete search history.

(56) References Cited

U.S. PATENT DOCUMENTS

| | | |
|---|---|---|
| 2017/0337412 A1 | 11/2017 | Bhat et al. |
| 2018/0300526 A1 | 10/2018 | Cho et al. |
| 2019/0013368 A1 | 1/2019 | Chung et al. |
| 2019/0114458 A1 | 4/2019 | Cho et al. |
| 2019/0212788 A1* | 7/2019 | Kwak ..................... G06F 3/017 |
| 2020/0046235 A1 | 2/2020 | Jung et al. |
| 2020/0057902 A1 | 2/2020 | Kim et al. |

FOREIGN PATENT DOCUMENTS

| | | |
|---|---|---|
| KR | 10-2018-0117003 | 10/2018 |
| KR | 10-2019-0004678 | 1/2019 |
| KR | 10-2019-0028429 | 3/2019 |
| KR | 10-2019-0041648 | 4/2019 |

* cited by examiner

ELECTRONIC DEVICE AND METHOD OF MEASURING BIOMETRIC INFORMATION USING THE SAME

CROSS-REFERENCE TO RELATED APPLICATION

This application claims priority from and the benefit of Korean Patent Application No. 10-2020-0010384, filed on Jan. 29, 2020, which is hereby incorporated by reference for all purposes as if fully set forth herein.

BACKGROUND

Field

Embodiments and implementations of the invention relate generally to an electronic device and a method of measuring biometric information using the same, and in particular, to an electronic device of measuring user's biometric information.

Discussion of the Background

Various electronic devices with new functions are being rapidly developed. In particular, a portable terminal, which serves as a smart device displaying an image or outputting image information or serves as an electronic device providing various convenient functions to a user, is being actively developed recently.

The above information disclosed in this Background section is only for understanding of the background of the inventive concepts, and, therefore, it may contain information that does not constitute prior art.

SUMMARY

An embodiment of the inventive concept provides an electronic device, which can measure user's biometric information using a front camera module and pixels near the front camera module, without an additional component to measure the biometric information.

An embodiment of the inventive concept provides an electronic device, which is configured to cause a change in arrangement of pixels near a front camera module and to allow the pixels near the front camera module to be operated in a high emission mode when it is in a biometric information measuring mode.

Additional features of the inventive concepts will be set forth in the description which follows, and in part will be apparent from the description, or may be learned by practice of the inventive concepts.

Embodiments provide an electronic device including a display module having a display panel, in which a signal transmission region, a peripheral display region adjacent to the signal transmission region, and a main display region spaced apart from the signal transmission region are provided, and a camera module overlapped with the signal transmission region. The display panel may include a plurality of first pixels, which are disposed in a unit region of the main display region, and a plurality of second pixels, which are disposed in a unit region of the peripheral display region. An emission area of green light in the unit region of the first pixels may be different from an emission area of green light in the unit region of the second pixels.

In an embodiment, the display module may include an opening defined in the signal transmission region.

In an embodiment, the emission area of green light in the unit region of the first pixels may be smaller than the emission area of green light in the unit region of the second pixels.

In an embodiment, the first pixels may include first color pixels emitting a green light, second color pixels emitting a red light, and third color pixels emitting a blue light. The second pixels may include the first color pixels and the second color pixels.

In an embodiment, the first pixels may include two first color pixels, one second color pixel, and one third color pixel, which are disposed in the unit region. The second pixels may include at least two first color pixels and at least one second color pixel, which are disposed in the unit region.

In an embodiment, the second pixels may further include the third color pixels. An emission area of blue light of the first pixels may be greater than an emission area of blue light of the second pixels.

In an embodiment, a plurality of the unit regions may be provided in the peripheral display region, and the second pixels in some of the unit regions may include the third color pixel.

In an embodiment, the number of the some of the unit regions may be smaller than half of the number of the unit regions.

In an embodiment, the second pixels in the some of the unit regions may include two first color pixels, one second color pixel, and one third color pixel.

In an embodiment, each of the first pixels and the second pixels may include four pixels per the unit region.

In an embodiment, the four pixels may include two pixels with a first area, one pixel with a second area, and one pixel with a third area. The first area may be smaller than the second area, and the second area may be smaller than the third area.

In an embodiment, in the case of the first pixels, the pixels with the first area may emit the green light, the pixel with the second area may emit red light, and the pixel with the third area may emit blue light. In the case of the second pixels, the pixels with the first area and the pixel with the third area may emit the green light, and the pixel with the second area may emit the red light.

In an embodiment, in the case of the second pixels, one of the pixels with the first area and the pixel with the third area may emit green light, and the other of the pixels with the first area and the pixel with the second area may emit red light.

In an embodiment, in the case of the second pixels, one of the pixels with the first area and the pixel with the second area may emit green light, and the other of the pixels with the first area and the pixel with the third area may emit red light.

In an embodiment, in the case of the first pixels, the pixels with the first area may emit the green light, the pixel with the second area may emit red light, and the pixel with the third area may emit blue light. In the case of the second pixels, one of the pixels with the first area may emit the blue light, the other of the pixels with the first area and the pixel with the second area may emit the green light, and the pixel with the third area may emit the red light.

In an embodiment, the electronic device may further include a control module controlling an emission mode of each of the first and second pixels.

In an embodiment, the control module may execute a biometric information measuring mode, when a user's finger is sensed by the camera module.

In an embodiment, the control module may execute a high emission mode of emitting a detection light from the first pixels toward the user's finger, if the biometric information measuring mode is executed.

In an embodiment, the camera module may sense a light amount of the detection light reflected from the user's finger, and the control module may measure biometric information on the user, based on the sensed light amount of the detection light.

Embodiments also include a biometric information measuring method using an electronic device including executing a biometric information measuring mode through a control module, when a user's finger is sensed, executing a high emission mode of emitting a detection light from a plurality of second pixels of a display panel toward the user's finger, through the control module, sensing the detection light reflected from the user's finger, using a camera module, and measuring biometric information on the user through the control module, based on the sensed light amount of the detection light. The display panel may be sectioned into a signal transmission region, a peripheral display region adjacent to the signal transmission region, and a main display region spaced apart from the signal transmission region, and may include a plurality of first pixels disposed in the main display region and the plurality of second pixels disposed in the peripheral display region. An emission area of a first color light in a unit region of the first pixels may be different from an emission area of the first color light in a unit region of the second pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

Example embodiments will be more clearly understood from the following brief description taken in conjunction with the accompanying drawings. The accompanying drawings represent non-limiting, example embodiments as described herein.

Figure 1:
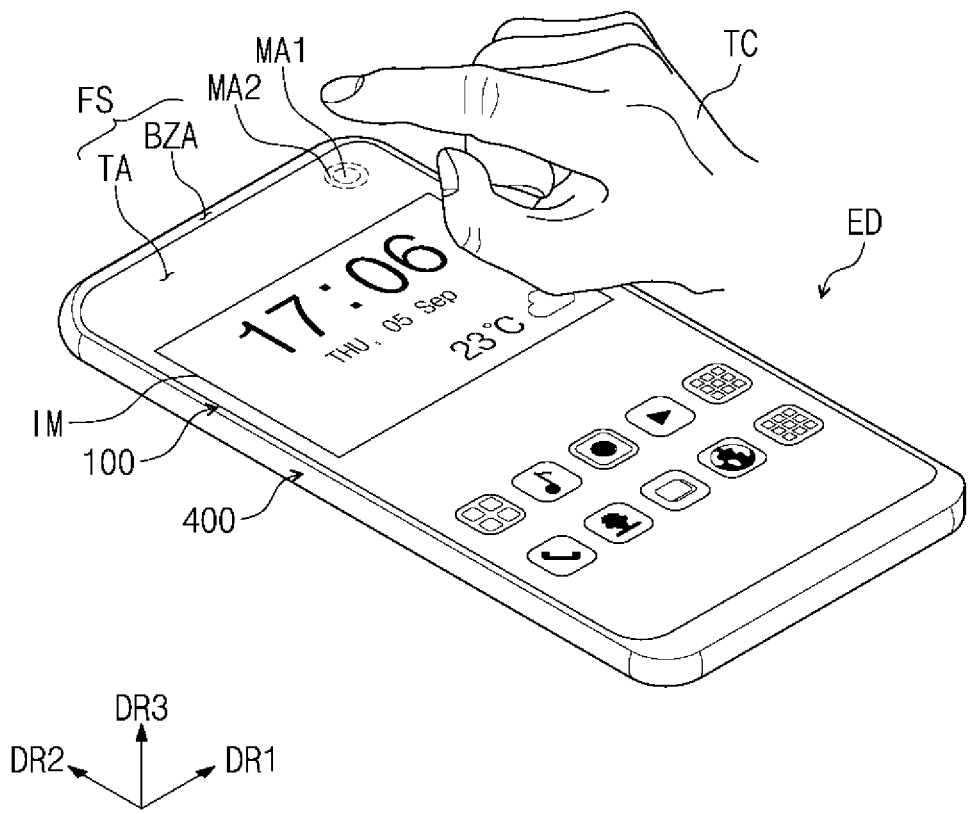
FIG. 1 is a perspective view illustrating an electronic device according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
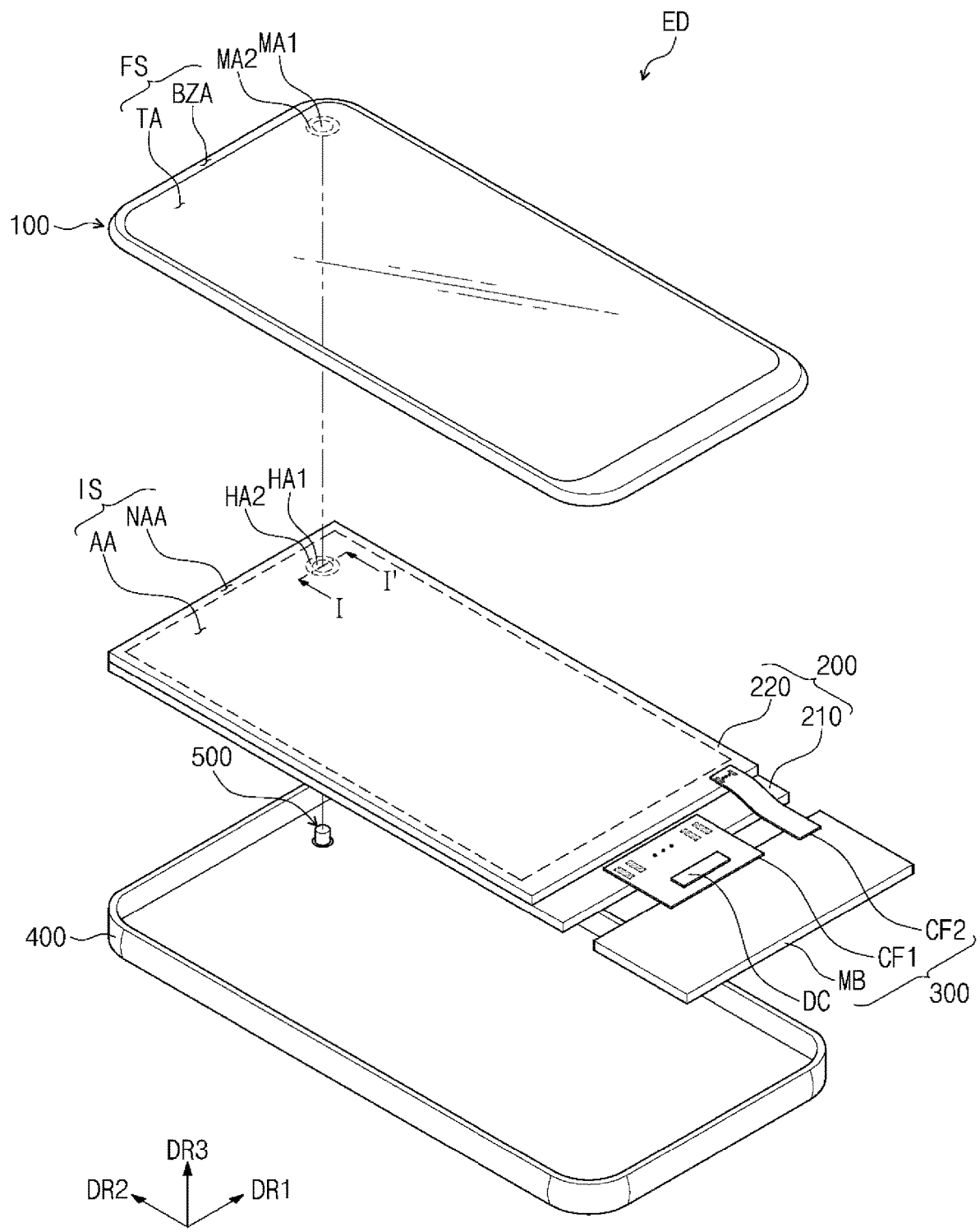
FIG. 2 is an exploded perspective view illustrating an electronic device according to an embodiment of the inventive concept.
Figure 3:
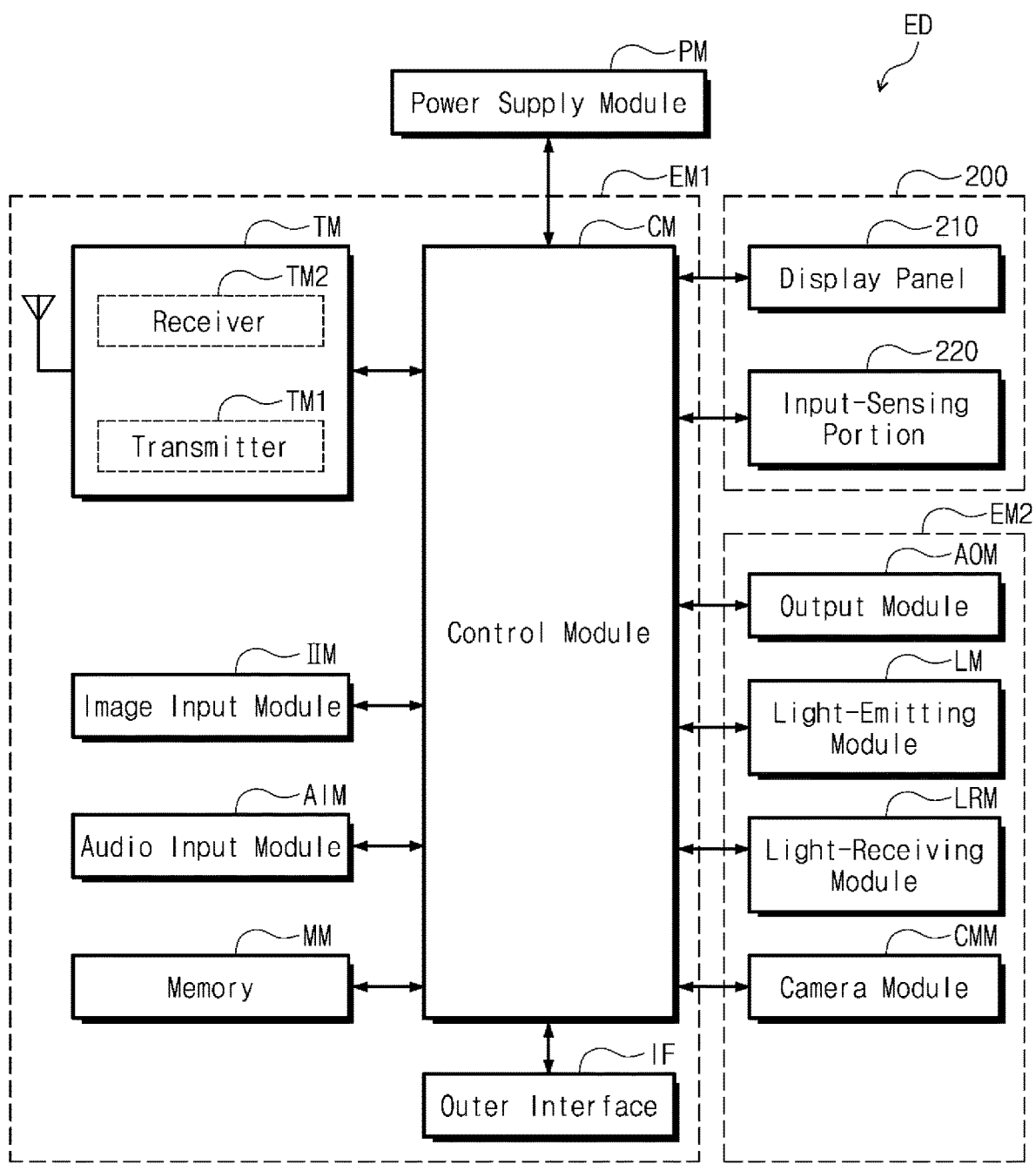
FIG. 3 is a block diagram illustrating an electronic device according to an embodiment of the inventive concept.

FIG. 1 is a perspective view illustrating an electronic device according to an embodiment of the inventive concept. FIG. 2 is an exploded perspective view illustrating an electronic device according to an embodiment of the inventive concept. FIG. 3 is a block diagram illustrating an electronic device according to an embodiment of the inventive concept.

Referring to FIGS. 1 to 3, an electronic device ED may display an image, when it is activated by an electrical signal applied thereto. The electronic device ED may be a tablet, a laptop, a computer, a television set, or the like. In the present embodiment, a smart phone will be described as an example of the electronic device ED.

The electronic device ED may include a display surface FS, which is parallel to each of a first direction DR1 and a second direction DR2 and is used to display an image IM in a third direction DR3. The display surface FS displaying the image IM may correspond to a front surface of the electronic device ED and a front surface of a window 100. Hereinafter, the display or front surface of the electronic device ED and the front surface of the window 100 may be indicated by using the same reference number. The image IM may be a video image or a still image. FIG. 1 illustrates a clock widget and a plurality of application icons as an example of the image IM.

In the present embodiment, a front or top surface and a rear or bottom surface of each element may be defined based on the display direction of the image IM. The front and rear surfaces may be opposite to each other in the third direction DR3 and a normal direction of each of the front and rear surfaces may be parallel to the third direction DR3. Meanwhile, directions indicated by the first to third directions DR1, DR2, and DR3 may be relative concept, and in an embodiment, they may be changed to indicate other directions.

The electronic device ED may include the window 100, a display module 200, a driving circuit portion 300, a housing 400, and a camera module 500. In the present embodiment, the window 100 and the housing 400 may be combined to each other to define an outer appearance of the electronic device ED.

The window 100 may include an optically transparent insulating material. For example, the window 100 may be formed of or include at least one of glass or plastic materials. The window 100 may have a multi- or single-layered structure. For example, the window 100 may include a plurality of plastic films, which are combined to each other by an adhesive material, or a glass substrate and a plastic film, which are combined to each other by an adhesive material.

The window 100 may include a transmission region TA and a bezel region BZA, when viewed in a plan view. In the present specification, the expression "when viewed in a plan view" may be used to describe a shape of an object viewed in the third direction DR3.

The transmission region TA may be an optically transparent region. The bezel region BZA may have a relatively low optical transmittance, compared with the transmission region TA. The bezel region BZA may define the shape of the transmission region TA. The bezel region BZA may be adjacent to the transmission region TA and may enclose the transmission region TA.

The bezel region BZA may have a predetermined color. The bezel region BZA may cover a non-active region NAA of the display module 200 and may prevent the non-active region NAA from being recognized by a user. However, the inventive concept is not limited to this example, and in an embodiment, the bezel region BZA may be omitted from the window 100.

In an embodiment, a first module region MA1 may be a region that is overlapped with the camera module 500. The electronic device ED may receive an external signal, which is required for the camera module 500, or provide a signal, which is output from the camera module 500, to the outside through the first module region MA1. For example, the camera module 500 may sense an approach of a user's finger through the first module region MA1. According to an embodiment of the inventive concept, the first module region MA1 may be defined to be overlapped with the transmission region TA. Thus, an area of the bezel region BZA may be reduced by the area of the first module region MA1, compared with the case that the first module region MA1 is provided in the bezel region BZA. A second module region MA2 may correspond to a region that is provided around the first module region MA1. In an embodiment, the second module region MA2 may include a light-blocking region. For example, the second module region MA2 may be a region that is overlapped with a light-blocking region BA of a display panel 210 (e.g., see FIG. 8B). The first module region MA1 may be overlapped with a first transmission region HA1 and the second module region MA2 may be overlapped with a second transmission region HA2. The second module region MA2 may have transmittance lower than that of the first module region MA1.

FIGS. 1 and 2 illustrate an example, in which the first and second module regions MA1 and MA2 are provided in a top right portion of the transmission region TA, but in certain embodiments, the first and second module regions MA1 and MA2 may be defined in various regions (e.g., a top left portion, a central portion, a bottom left portion, or a bottom right portion of the transmission region TA).

As illustrated in FIG. 2, the display module 200 may be disposed below the window 100. In the present specification, the preposition "below" may be used to indicate a direction that is opposite to a propagation direction of an image light emitted from the display module 200. The display module 200 may be configured to display the image IM and to sense an external input TC from a finger, hand, or other body part of a user. The display module 200 may include a front surface IS with an active region AA and the non-active region NAA. The active region AA may be a region that is activated according to an electrical signal.

In the present embodiment, the active region AA may be used to display the image IM and to sense the external input TC. The transmission region TA may be overlapped with at least the active region AA. For example, the transmission region TA may be overlapped with a front surface or at least a portion of the active region AA. Thus, a user may recognize the image IM through the transmission region TA or may input the external input TC through the transmission region TA.

The non-active region NAA may be a region covered with the bezel region BZA. The non-active region NAA may be adjacent to the active region AA. The non-active region NAA may enclose the active region AA. A driving circuit, a driving line, or the like, which is used to operate the active region AA, may be disposed in the non-active region NAA.

In the present embodiment, the display module 200 is illustrated to have a flat shape in the active region AA and the non-active region NAA, but the inventive concept is not limited to this example. For example, the display module 200 may be partially curved in the non-active region NAA. Here, the display module 200 in the non-active region NAA may be bent in such a way that a portion thereof faces a rear surface of the electronic device ED, and in this case, the area of the bezel region BZA in the front surface of the electronic device ED may be reduced. Furthermore, in the active region AA, the display module 200 may be provided to have a partially-curved shape. In certain embodiments, the non-active region NAA may be omitted from the display module 200.

The display module 200 may include the display panel 210 and an input-sensing portion 220.

The display panel 210 may be an element substantially producing the image IM. The image IM produced by the display panel 210 may be displayed on the front surface IS of the display module 200 and may be provided to the outside or a user through the transmission region TA.

The input-sensing portion 220 may sense the external input TC applied from the outside. The external input TC may correspond to a user's finger. For example, the input-sensing portion 220 may sense the external input TC provided through the window 100. The external input TC may be a user's input. The user input may include various types of external inputs, such as a part of a user's body, light, heat, pressure, or a pen. In the present embodiment, the external input TC is illustrated to be a touch event, which is produced from a user's hand and is transmitted through the display surface FS of the electronic device ED, but the inventive concept is not limited to this example. For example, as described above, the external input TC may be provided in various shapes, and in certain embodiments, the external input TC may be input through the side or rear surface of the electronic device ED, depending on the structure of the electronic device ED. In an embodiment, the input-sensing portion 220 may sense the external input TC applied to the second module region MA2.

The driving circuit portion 300 may be electrically connected to the display panel 210 and the input-sensing portion 220. The driving circuit portion 300 may include a main circuit board MB, a first flexible film CF1, a second flexible film CF2, and a driving chip DC.

The first flexible film CF1 may be electrically connected to the display panel 210. The first flexible film CF1 may connect the display panel 210 to the main circuit board MB. The first flexible film CF1 may be coupled to pads of the display panel 210 (hereinafter, display pads), which are disposed in the non-active region NAA. The first flexible film CF1 may provide electrical signals, which are used to operate the display panel 210, to the display panel 210. The electrical signals may be generated by the first flexible film CF1 or the main circuit board MB.

The second flexible film CF2 may be electrically connected to the input-sensing portion 220. The second flexible film CF2 may connect the input-sensing portion 220 to the main circuit board MB. The second flexible film CF2 may be coupled to pads of the input-sensing portion 220 (hereinafter, sensing pads), which are disposed in the non-active region NAA. The second flexible film CF2 may provide electrical signals, which are used to operate the input-sensing portion 220, to the input-sensing portion 220. The electrical signals may be generated by the second flexible film CF2 or by the main circuit board MB.

The main circuit board MB may include various driving circuits, which are used to drive the display module 200, or a connector and so forth, which is used to supply an electric power. The first flexible film CF1 and the second flexible film CF2 may be coupled to the main circuit board MB. According to this embodiment, the display module 200 may be easily controlled through the single main circuit board MB. However, the inventive concept is not limited to this example or a specific embodiment, and in the display module 200 according to an embodiment, the display panel 210 and the input-sensing portion 220 may be connected to different main circuit boards, one of the first flexible film CF1 and the second flexible film CF2 may not be connected to the main circuit board MB, and the driving chip DC may be electrically connected to the display panel 210 to provide operation signals to the pixels of the display panel.

In an embodiment, a region of the display module 200 corresponding to the first module region MA1 may have transmittance higher than that of the active region AA that is not overlapped with the first module region MA1. For example, at least a portion of elements constituting the display panel 210 and the input-sensing portion 220 may be removed. Thus, the camera module 500, which is disposed to be overlapped with the first module region MA1, may easily transmit or receive a signal through the first module region MA1.

Referring to FIG. 2, a high transmittance region may be defined in a region of the display module 200 corresponding to the first module region MA1. The high transmittance region may correspond to the first transmission region HA1.

In an embodiment, the first transmission region HA1 may be defined in the active region AA to penetrate the display module 200. Because the first transmission region HA1 is defined in the active region AA, the first module region MA1 may be provided in the transmission region TA. The second transmission region HA2 may correspond to a region that is provided around the first transmission region HA1. The second transmission region HA2 may have transmittance lower than that of the first transmission region HA1. A portion of the second transmission region HA2 may be overlapped with the light-blocking region BA (e.g., see FIG. 8B).

When viewed in a plan view, the camera module 500 may be overlapped with the first transmission region HA1 and the first module region MA1. The camera module 500 may be disposed below the display module 200, and at least a portion of the camera module 500 may be disposed in the first transmission region HA1. The camera module 500 may receive an external input transmitted through the first transmission region HA1 or may provide an output to the outside through the first transmission region HA1.

The housing 400 may be coupled to the window 100. The housing 400 may be coupled to the window 100 to provide an internal space. The display module 200 and the camera module 500 may be stored in the internal space.

The housing 400 may be formed of or include a material having a relatively high stiffness or strength. For example, the housing 400 may include at least one of glass, plastic, or metallic materials or may include a plurality of frames and/or plates that are made of the glass, plastic, or metallic materials. The housing 400 may stably protect elements of the electronic device ED, which are disposed in the internal space, from an external impact.

Referring to FIG. 3, the electronic device ED may include the display module 200, a power supply module PM, a first electronic module EM1, and a second electronic module EM2. The display module 200, the power supply module PM, the first electronic module EM1, and the second electronic module EM2 may be electrically connected to each other.

The power supply module PM may supply an electric power to the electronic device ED. In an embodiment, the power supply module PM may include a typical battery module.

The first electronic module EM1 and the second electronic module EM2 may include various functional modules, which are used to operate the electronic device ED.

The first electronic module EM1 may be directly mounted on a mother board electrically connected to the display module 200. Alternatively, the first electronic module EM1 may be mounted on a separate substrate and may be electrically connected to a motherboard through a connector (not illustrated) or the like.

The first electronic module EM1 may include a control module CM, a wireless communication module TM, an image input module IIM, an audio input module AIM, a memory MM, and an outer interface IF. At least one of the modules may not be mounted on the motherboard and may be electrically connected to the motherboard through a flexible circuit board.

The control module CM may control overall operations of the electronic device ED. The control module CM may be a micro-processor. For example, the control module CM may activate or inactivate the display module 200. The control module CM may control other modules (e.g., the image input module IIM or the audio input module AIM), based on a touch signal received from the display module 200. The control module CM may receive information, which is needed to detect user's biometric information, from the camera module 500. For example, the control module CM may be used to measure an amount of light that is emitted from the camera module 500 and is reflected by a user's finger. If the user's finger is sensed through the camera module 500 or the input-sensing portion 220, the control module CM may control other modules. For example, the control module CM may control the display panel 210, the power supply module PM, the image input module IIM, and so forth, based on the amount of the light reflected by the user's finger. The control module CM may control an emission mode of a pixel PX of the display panel 210. In an embodiment, the control module CM may control an emission mode of each of first and second pixels, which are provided in respective unit regions UA1 and UA2 (e.g., see FIG. 5). The control module CM may measure the user's biometric information, in conjunction with the camera module 500 or the like. This will be described in more detail with reference to FIG. 7.

The wireless communication module TM may transmit and receive a wireless signal to and from another terminal via a Bluetooth or a Wi-Fi line. The wireless communication module TM may transmit and receive a voice signal via a typical communication line. The wireless communication module TM may include a transmitter TM1, which modulates and transmits a signal to be transmitted, and a receiver TM2, which demodulates a received signal.

The image input module IIM may process an image signal and convert it into image data that can be displayed on the display module 200. The audio input module AIM may receive an external audio signal through a microphone in a recording mode, a voice recognizing mode, and so forth, and then convert it into electrical voice data.

The outer interface IF may serve as an interface that is connected to an external charger, a wired/wireless data port, a card socket (e.g., a memory card or a SIM/UIM card), and so forth.

The second electronic module EM2 may include an audio output module AOM, a light-emitting module LM, a light-receiving module LRM, a camera module CMM, or the like. At least one of the modules may be directly mounted on a motherboard. Alternatively, at least one of the modules may be mounted on another substrate and may be electrically connected to the display module 200 or the first electronic module EM1 through a connector (not illustrated).

The audio output module AOM may convert audio data, which are transmitted from the wireless communication module TM or are stored in the memory MM, and may output the converted audio data to the outside.

The light-emitting module LM may generate and emit light. An infrared light module IRM may emit an infrared light. The infrared light module IRM and the light-emitting module LM may include LED devices. The light-receiving module LRM may sense the infrared light. The light-receiving module LRM may be activated, when an infrared light of specific level or higher is sensed. The light-receiving module LRM may include a CMOS image sensor. An infrared light emitted from the light-emitting module LM may be reflected by an external object (e.g., a user's finger or face), and the reflected infrared light may be incident into the light-receiving module LRM. The camera module CMM may be used to obtain an image of an external object.

In an embodiment, the camera module 500 may include the camera module CMM and the light-receiving module LRM. The camera module 500 may sense an external object through the first module region MA1 and the first transmission region HA1. In an embodiment, a plurality of camera modules 500 may be provided.

Figure 4:
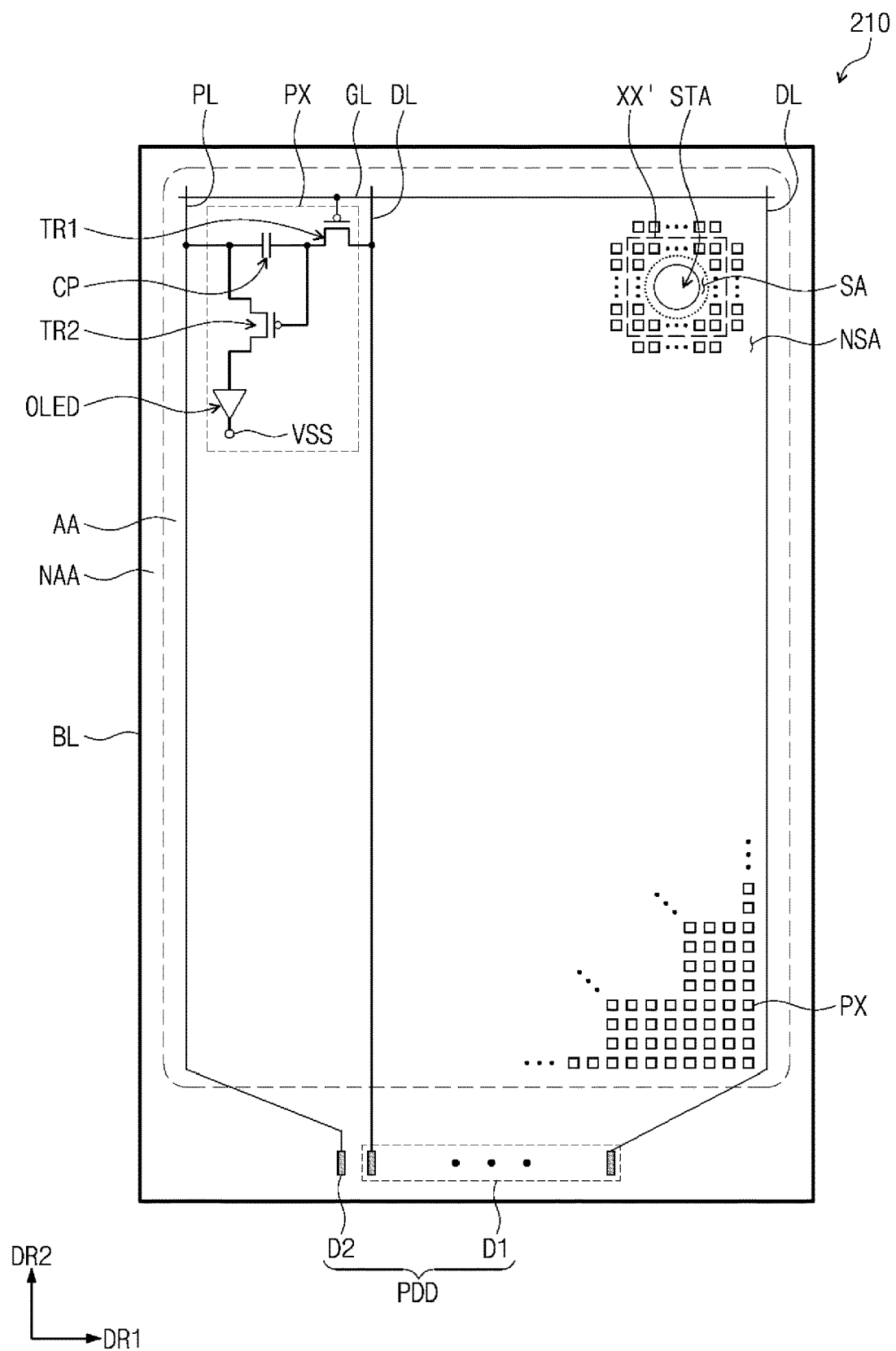
FIG. 4 is a plan view illustrating a display panel according to an embodiment of the inventive concept.

FIG. 4 is a plan view illustrating a display panel according to an embodiment of the inventive concept.

Referring to FIG. 4, the display panel 210 may include a base layer BL, a plurality of pixels PX, a plurality of signal lines GL, DL, and PL, and a plurality of display pads PDD.

The active region AA of the display panel 210 may include a region, which is used to display an image, and the non-active region NAA may include a region, in which a driving circuit, a driving line, or the like is disposed. The active region AA and the non-active region NAA of the display panel 210 are illustrated in FIG. 4. The pixels PX may be disposed in the active region AA.

The base layer BL may be a silicon substrate, a plastic substrate, a glass substrate, an insulating film, or a stack including a plurality of insulating layers.

The active region AA may include a signal transmission region STA, a peripheral display region SA, and a main display region NSA. The signal transmission region STA may correspond to a region of the active region AA, which is not used to display an image. The signal transmission region STA may correspond to a region overlapped with the camera module 500. The signal transmission region STA may correspond to a high transmittance region. In an embodiment, an opening may be defined in the signal transmission region STA. The peripheral display region SA may be adjacent to the signal transmission region STA. The main display region NSA may be a region, which is farther apart from the signal transmission region STA than the peripheral display region SA and is provided to enclose the peripheral display region SA.

The peripheral display region SA and the main display region NSA may be a display region, which is used to display an image, and may be enclosed by the non-active region NAA. The pixels PX may be disposed on the base layer BL to correspond to the peripheral display region SA and the main display region NSA.

The signal transmission region STA may be overlapped with the first module region MA1 of the window 100. The peripheral display region SA may be overlapped with the second module region MA2 of the window 100.

The pixels PX, which are used to produce an image, may not be disposed on the signal transmission region STA of the base layer BL. Thus, the signal transmission region STA may be defined as a high transmittance region or a non-display region, in the active region AA. The pixels PX may be disposed on the peripheral display region SA and the main display region NSA of the base layer BL. Thus, the peripheral display region SA and the main display region NSA may be defined as a low transmittance region or a display region, in the active region AA.

The signal lines GL, DL, and PL may be connected to the pixels PX and may be used to deliver electrical signals to the pixels PX. The signal lines in the display panel 210 may include a scan line GL, a data line DL, and a power line PL, as exemplarily illustrated in FIG. 4. However, the inventive concept is not limited to this example or a specific embodiment, and the signal lines GL, DL, and PL may further include at least one of an initialization voltage line or an emission control line.

In the present embodiment, an example circuit diagram of one of the pixels PX is illustrated in an enlarged manner. The pixel PX may include a first transistor TR1, a capacitor CP, a second transistor TR2, and a light-emitting device OLED. The first transistor TR1 may be a switching device controlling an on/off state of the pixel PX. The first transistor TR1 may transmit or block a data signal transmitted through the data line DL, in response to a scan signal transmitted through the scan line GL.

The capacitor CP may be connected to the first transistor TR1 and the power line PL. The capacitor CP may be used to store electric charges, and an amount of the electric charges stored in the capacitor CP may be determined by a difference between a data signal transferred from the first transistor TR1 and a first power signal applied to the power line PL.

The second transistor TR2 may be connected to the first transistor TR1, the capacitor CP, and the light-emitting device OLED. The second transistor T2 may control a driving current flowing through the light-emitting device OLED, based on an amount of electric charges stored in the capacitor CP. A turn-on time of the second transistor TR2 may be determined depending on the amount of charges stored in the capacitor CP. During the turn-on time of the second transistor TR2, the second transistor TR2 may provide the first power signal, which is transferred through the power line PL, to the light-emitting device OLED.

The light-emitting device OLED may generate light or control an amount of light, according to an electrical signal. For example, the light-emitting device OLED may include an organic light emitting device or a quantum dot light emitting device.

The light-emitting device OLED may be connected to a power terminal VSS and may receive a power signal (hereinafter, a second power signal), which is different from the first power signal provided through the power line PL. A difference in voltage between the electrical signal provided from the second transistor TR2 and the second power signal may determine an amount of the driving current flowing through the light-emitting device OLED, and in this case, an intensity of the light generated by the light-emitting device OLED may be determined by the amount of the driving current. However, the inventive concept is not limited to this example or a specific embodiment, and in an embodiment, the pixel PX may include electronic devices, which are provided in various structures or arrangements.

The display pads PDD may include a first pad D1 and a second pad D2. The first pad D1 may include a plurality of first pads, which are connected to the data lines DL, respectively. The second pad D2 may be electrically connected to the power line PL. The display panel 210 may provide electrical signals, which are provided from the outside, to the pixels PX through the display pads PDD. In an embodiment, the display pads PDD may further include other pads, which are used to receive other electrical signals, in addition to the first pad D1 and the second pad D2, but the inventive concept is not limited to this example or a specific embodiment.

Figure 5:
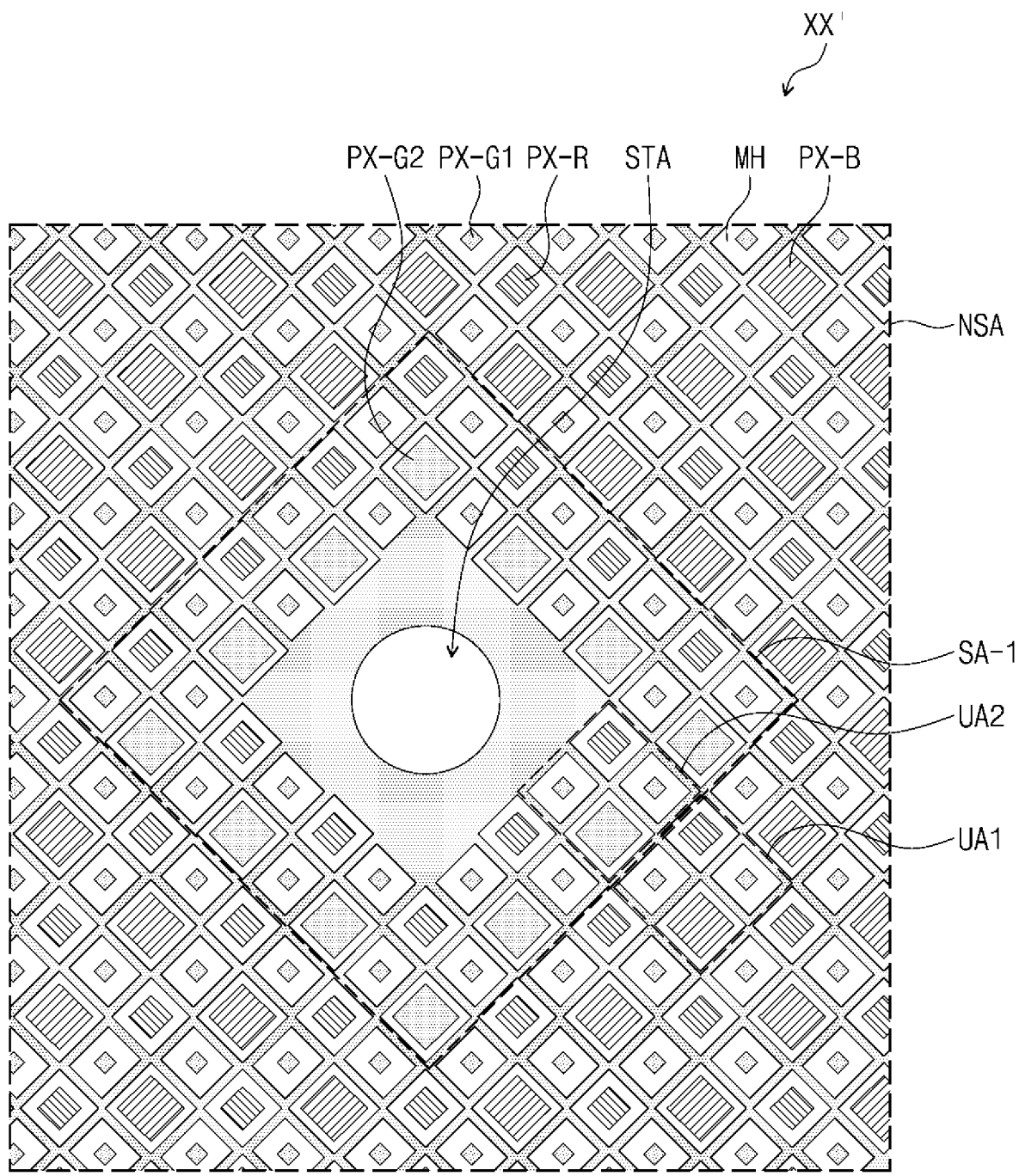
FIG. 5 is a plan view illustrating a plurality of first and second pixels according to an embodiment of the inventive concept.

FIG. 5 is a plan view illustrating a plurality of first and second pixels according to an embodiment of the inventive concept. FIG. 5 is an enlarged plan view illustrating a region XX' of FIG. 4.

Referring to FIG. 5, the display panel 210 may include a plurality of first pixels, which are disposed in a unit region UA1 of the main display region NSA. The display panel 210 may include a plurality of second pixels, which are disposed in a unit region UA2 of a peripheral display region SA-1. FIG. 5 illustrates an example, in which the peripheral display region SA-1 has twelve unit regions UA2 adjacent to the signal transmission region STA, but the inventive concept is not limited to this example. For example, the peripheral display region SA-1 may be configured to have twelve or more unit regions UA2, which are provided to be closer to the signal transmission region STA than the main display region NSA.

The peripheral display region SA-1 may not have a shape enclosing the signal transmission region STA, as long as the peripheral display region SA-1 may be provided adjacent to the signal transmission region STA. The inventive concept is not limited to a specific shape (e.g., a square) of the peripheral display region SA-1, and the shape of the peripheral display region SA-1 may be variously changed as long as it includes a sufficient number of the second pixels to realize the inventive concepts. For example, the peripheral display region SA-1 may be a dodecagonal region. In an embodiment, the first pixels may refer to pixels included in the unit region UA1 of the main display region NSA, and the second pixels may refer to pixels included in the unit region UA2 of the peripheral display region SA-1. Here, the pixels PX may include a first color pixel PX-G (PX-G1 and/or PX-G2), a second color pixel PX-R, and a third color pixel PX-B and may be used as a generic term indicating all of them. The first color pixel PX-G may emit a green light, the second color pixel PX-R may emit a red light, and the third color pixel PX-B may emit a blue light.

In an embodiment, the first pixels may include the first color pixel PX-G, the second color pixel PX-R, and the third color pixel PX-B. The second pixels may include the first color pixel PX-G and the second color pixel PX-R.

All of the first pixels and the second pixels may include a plurality of first color pixels PX-G1 and PX-G2 and the second color pixel PX-R.

In an embodiment, an emission area of green light in the unit region UA1 of the first pixels may be different from an emission area of green light in the unit region UA2 of the second pixels. For example, the emission area of green light in the unit region UA1 of the first pixels may be smaller than the emission area of green light in the unit region UA2 of the second pixels. The number of the first pixels PX-G may be larger in the second pixels than in the first pixels.

In an embodiment, the first pixels in a unit region UA1 may include two first color pixels PX-G1 and PX-G2, one second color pixel PX-R, and one third color pixel PX-B, and the second pixels in a unit region UA2 may include only at least two first color pixels PX-G1 and PX-G2 and at least one second color pixel PX-R. In an embodiment, the second pixels may further include the third color pixel PX-B. In this case, an emission area of the third color pixel PX-B in the second pixels may be smaller than an emission area of the third color pixel PX-B in the first pixels.

In an embodiment, a plurality of the unit regions UA2 may be provided in the peripheral display region SA-1. In this case, the second pixels may include the third color pixel PX-B, which is provided in some of the unit regions UA2. The number of the unit regions UA2 with the third color pixel PX-B may be smaller than half of the number of the unit regions UA2 in the peripheral display region SA-1. The second pixels in the unit regions UA2 with the third color pixel PX-B may include two first color pixels PX-G, one second color pixel PX-R, and one third color pixel PX-B. In this case, the second pixels in some unit regions of the peripheral display region SA-1 may include the first color pixels, the second color pixel, and the third color pixel, similar to the first pixels, but the emission area of the green light emitted from the first color pixels may still be larger in the unit region of the second color pixels than in the unit region of the first pixels.

The first pixels and the second pixels may include four pixels per each unit region. The four pixels may include two pixels with a first area, one pixel with a second area, and one pixel with a third area, where the first area may be smaller than the second area and the second area may be smaller than the third area. In an embodiment, in the case of the first pixels, the pixels with the first area may be the first color pixels PX-G emitting the green light, the pixel with the second area may be the second color pixels PX-R emitting the red light, and the pixel with the third area may be the third color pixels PX-B emitting the blue light. In the case of the second pixels, the pixels with the first area and the pixel with the third area may be the first color pixels PX-G emitting the green light, and the pixel with the second area may be the second color pixel PX-R emitting the red light.

Figure 6A:
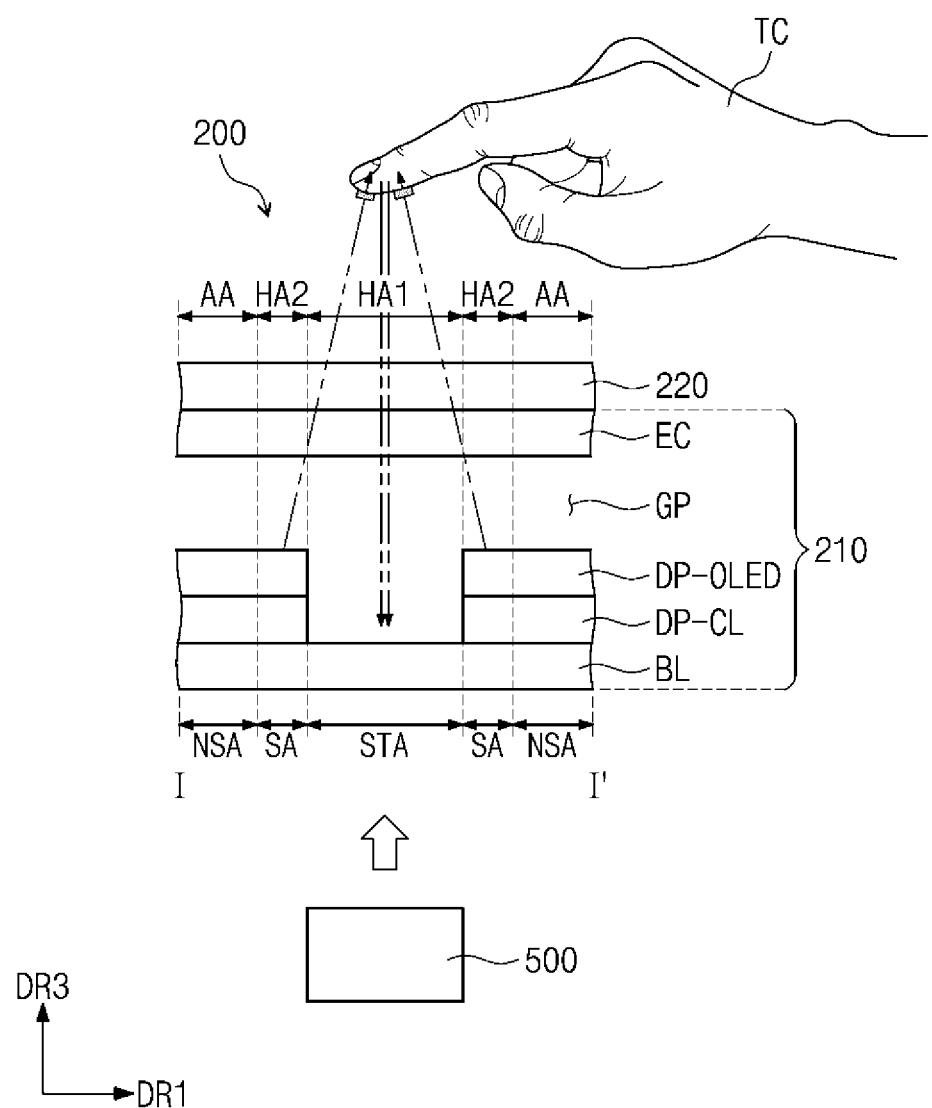
FIGS. 6A and 6B are sectional views illustrating cross-sections taken along a line I-I' of FIG. 2.
Figure 6B:
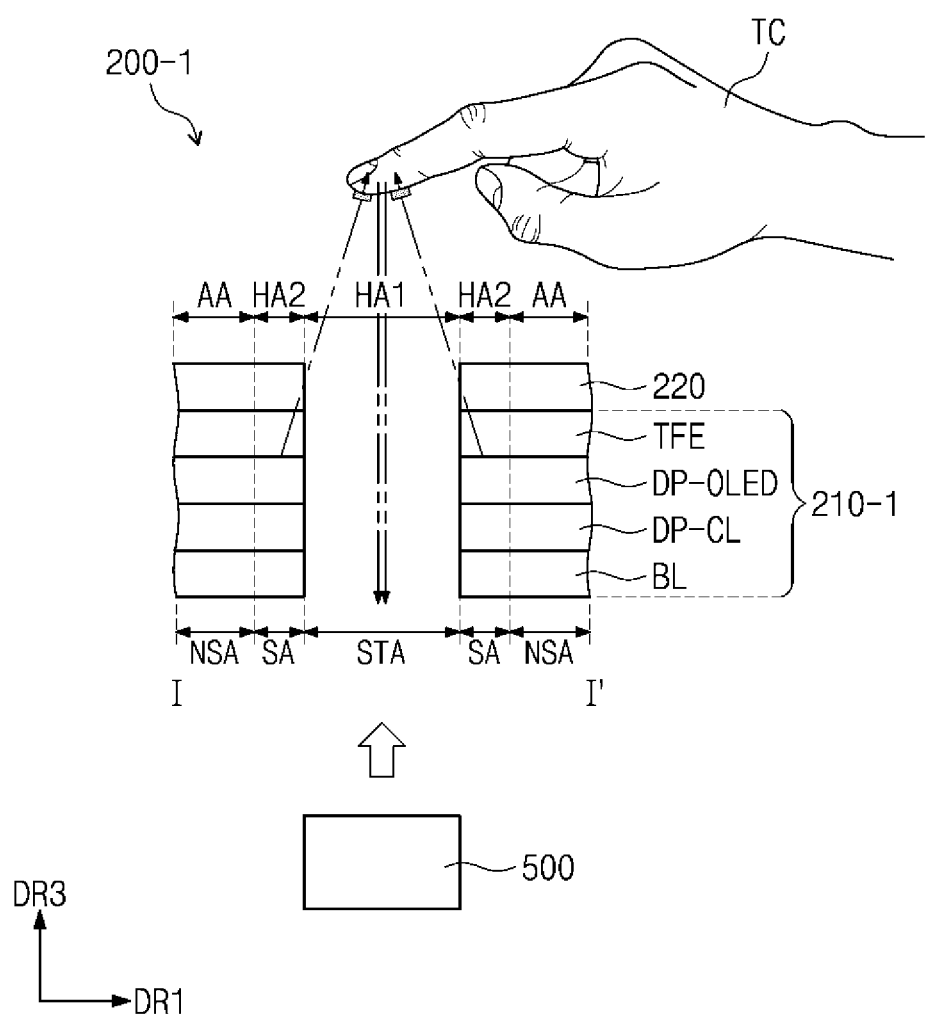

FIGS. 6A and 6B are sectional views illustrating cross-sections taken along a line I-I' of FIG. 2.

In detail, FIG. 6A is a sectional view illustrating a rigid-type display module 200 according to an embodiment of the inventive concept, and FIG. 6B is a sectional view illustrating a flexible-type display module 200-1 according to an embodiment of the inventive concept. In the case of the flexible-type display module 200-1, a thin encapsulation layer TFE may be separately described and the remaining elements will be described along with the rigid-type display module 200.

As illustrated in FIG. 6A, the rigid-type display panel 210 may include the base layer BL, a circuit device layer DP-CL disposed on the base layer BL, and a display device layer DP-OLED and an encapsulation substrate EC disposed on the circuit device layer DP-CL.

The base layer BL may include a glass substrate. In addition, the base layer BL may include a substrate having a substantially uniform refractive index within a visible wavelength range. The circuit device layer DP-CL may include at least one insulating layer and a circuit device. The circuit device layer DP-CL may include at least one transistor. In the embodiments to be described below, the insulating layer of the circuit device layer DP-CL may include at least one inorganic layer and/or at least one organic layer. The circuit device may include signal lines, a pixel driving circuit, and so forth. The display device layer DP-OLED may include at least one light-emitting device. The display device layer DP-OLED may include organic light emitting diodes (OLEDs) serving as the light-emitting device. The display device layer DP-OLED may include a pixel definition layer, which is formed of or includes, for example, at least one of organic materials. The encapsulation substrate EC may be a transparent substrate. For example, the encapsulation substrate EC may include a glass substrate. In addition, the encapsulation substrate EC may include a substrate having a substantially uniform refractive index within a visible wavelength range. The structure of the stack including the base layer BL to the display device layer DP-OLED may be defined as a lower display substrate. A gap GP may be formed between the display device layer DP-OLED and the encapsulation substrate EC. The gap GP may be filled with the air or inert gases (hereinafter, an external gas).

As illustrated in FIG. 6B, a flexible-type display panel 210-1 may include the base layer BL, the circuit device layer DP-CL disposed on the base layer BL, and the display device layer DP-OLED and the thin encapsulation layer TFE disposed on the circuit device layer DP-CL.

The thin encapsulation layer TFE may seal or encapsulate the display device layer DP-OLED. The thin encapsulation layer TFE may include at least one insulating layer. In an embodiment, the thin encapsulation layer TFE may include at least one inorganic layer (hereinafter, an inorganic encapsulation layer). In an embodiment, the encapsulation layer TFE may include at least one organic layer (hereinafter, an organic encapsulation layer) and at least one inorganic encapsulation layer. The inorganic encapsulation layer may protect the display device layer DP-OLED from moisture or oxygen, and the organic encapsulation layer may protect the display device layer DP-OLED from a contamination material such as dust particles. The inorganic encapsulation layer may include a silicon nitride layer, a silicon oxynitride layer, a silicon oxide layer, a titanium oxide layer, or an aluminum oxide layer, but the inventive concept is not limited to these examples. The organic encapsulation layer may include an acryl-based organic layer, but the inventive concept is not limited to this example.

The flexible-type display module 200-1 may include the first transmission region HA1 and the second transmission region HA2, which are defined in the active region AA and correspond to the high transmittance region and the low transmittance region, respectively. The first transmission region HA1 of a flexible-type display module 200-1 may be of an opened type and may include an opening defined therein, unlike the first transmission region HA1 of a closed-and rigid-type display module 200. The first transmission region HA1 may be overlapped with the signal transmission region STA of the flexible-type display panel 210-1. The second transmission region HA2 may be overlapped with the peripheral display region SA of the flexible-type display panel 210-1. The active region AA, except for the first transmission region HA1 and the second transmission region HA2, may be overlapped with the main display region NSA of the flexible-type display panel 210-1.

Although not illustrated in FIGS. 6A and 6B, the display device layer DP-OLED may include a plurality of pixels. The first pixels may be disposed in a region of the display device layer DP-OLED corresponding to the main display region NSA, and the second pixels may be disposed in another region corresponding to the peripheral display region SA. Referring to FIGS. 6A and 6B, the display modules 200 and 200-1 may emit a green light and a red light, which is emitted from the light-emitting devices of the display device layer DP-OLED disposed in the peripheral display region SA of the display panel 210, toward a user's finger. The green light and the red light may be reflected by the user's finger and may be incident into the camera module 500 through the signal transmission region STA, and here, the reflected light may contain user's biometric information. This will be described in more detail with reference to FIG. 7.

The input-sensing portion 220 may be disposed on the display panels 210 and 210-1. For example, the input-sensing portion 220 of the flexible type display module 200-1 may be directly disposed on the flexible type display panel 210-1 or may be coupled to the flexible type display panel 210-1 through an adhesive member. The input-sensing portion 220 may be formed on the flexible type display panel 210-1 through a process which is successively performed after the formation of the flexible type display panel 210-1.

Figure 7:
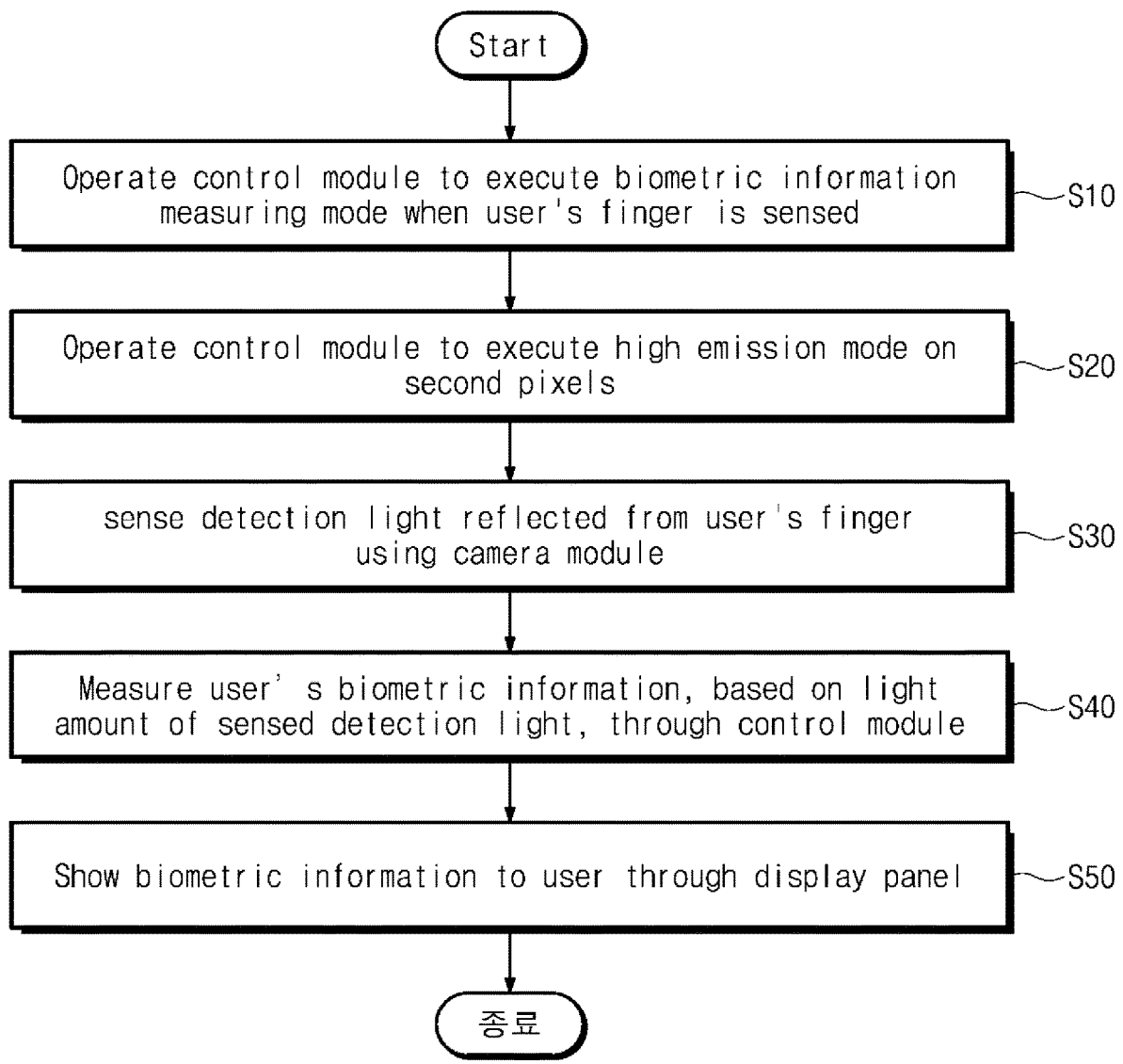
FIG. 7 is a flow chart of a biometric information measuring method using an electronic device according to an embodiment of the inventive concept.

FIG. 7 is a flow chart of a biometric information measuring method using an electronic device according to an embodiment of the inventive concept.

Referring to FIG. 7, a biometric information measuring method using an electronic device may include an operation (not illustrated) of sensing a user's finger. The user's finger may be sensed by the light-receiving sensor or the light-receiving module LRM of the camera module 500. In the case where there is a touch event caused by a user, the user's finger may be sensed by an input-sensing sensor (not illustrated) that is overlapped with the second transmission region HA2 of the input-sensing portion 220.

The biometric information measuring method using the electronic device may include an operation S10 of operating the control module CM to execute a biometric information measuring mode when the user's finger is sensed. The biometric information measuring mode may include a mode of measuring a user's heart rate and a mode of measuring oxygen saturation of hemoglobin in user's blood. If the biometric information measuring mode is executed, the electronic device ED may provide a user interface (UI) or a user experience (UX), which allows for various inputs, to the user through the active region AA of the display panel 210.

The biometric information measuring method using the electronic device may include an operation S20 of operating the control module CM to execute a high emission mode, in which a detection light is emitted from the second pixels PX of the display panel 210 toward the user's finger. If, in the biometric information measuring mode after the operation S10, an addition input, which initiates a biometric information measuring, is received from a user, the control module CM of the electronic device ED may execute a high emission mode increasing an amount of an emission light. For example, the high emission mode may be a high brightness mode (HBM) which is executed when a peripheral brightness is higher than a predetermined value. In detail, the control module CM may render the second pixels, which are disposed in the peripheral display region SA of the display panel 210, to be executed in the high emission mode, through the driving chip DC of the driving circuit portion 300. If the high emission mode is executed, the second pixels, which are disposed in the peripheral display region SA of the display panel 210, may emit a detection light whose brightness is higher than a typical brightness (e.g., about 200 nt) of light emitted from the first pixels in the main display region NSA.

For example, the second pixels may emit a detection light whose highest brightness is about 2000 nt. The detection light may be emitted in the high emission mode, and the high emission mode may include the HBM and may include various emission modes, in which an amount of light emitted from the light-emitting device is maximized and a gamma value is controlled to maintain the image quality. Here, the detection light may correspond to a light, which is emitted from the second pixels to detect user's biometric information during the reflection from the user's finger. The detection light may include the green light and the red light. In an embodiment, the detection light may include a tiny amount of blue light, in addition to the green light and the red light. The green light may be used to measure a user's heart rate, and the red light, along with the green light, may be used to measure oxygen saturation of hemoglobin in a user's blood.

The biometric information measuring method using the electronic device may include an operation S30 of sensing the detection light reflected from the user's finger using a camera module. If the detection light is emitted from the second pixels in the peripheral display region SA, the detection light may be reflected from the user's finger. In the case where the detection light is the green light, a fraction of the detection light may be absorbed in a user's blood during the reflection from the user's finger. The detection light corresponding to the green light may sense a variation in blood flow rate in the user's finger, which is used to obtain information required to measure a user' heart rate, during the reflection from the user's finger. In other words, the camera module 500 may sense a light amount of the detection light, which is partly absorbed and reflected by the blood in the user's finger. The camera module 500 may sequentially sense the green light and the red light, which are sequentially emitted in the high emission mode. For example, the control module CM may turn on or off the green light or the red light, in accordance with the turn-on and turn-off of the high emission mode. Although the high emission mode is executed for the sensing efficiency, the control module CM may temporarily turn off the high emission mode at the turn-on timing of the green light and red light, and this may make it possible to avoid the light interference issue.

The biometric information measuring method using the electronic device may include an operation S40 of measuring user's biometric information, based on the sensed light amount of the detection light, through the control module CM. In detail, because the green light is partly absorbed in the user's blood, a light amount of the detection light corresponding to the green light reflected from the user's finger may be different from a light amount of the detection light, which is the green light emitted from the second pixels, and in the electronic device, this difference may be used to measure a variation in blood flow rate and consequently a heart rate of the user. The oxygen saturation of hemoglobin may be measured by comparing intensities of the green and red lights in the detection light, which is reflected from the user's finger and is incident into the camera module 500.

The biometric information measuring method using the electronic device may include an operation S50 of illustrating the measured biometric information to the user through the display panel 210. In the biometric information measuring method using the electronic device, the user's biometric information may be provided to the user through a user UI/UX in various manners.

Figure 8A:
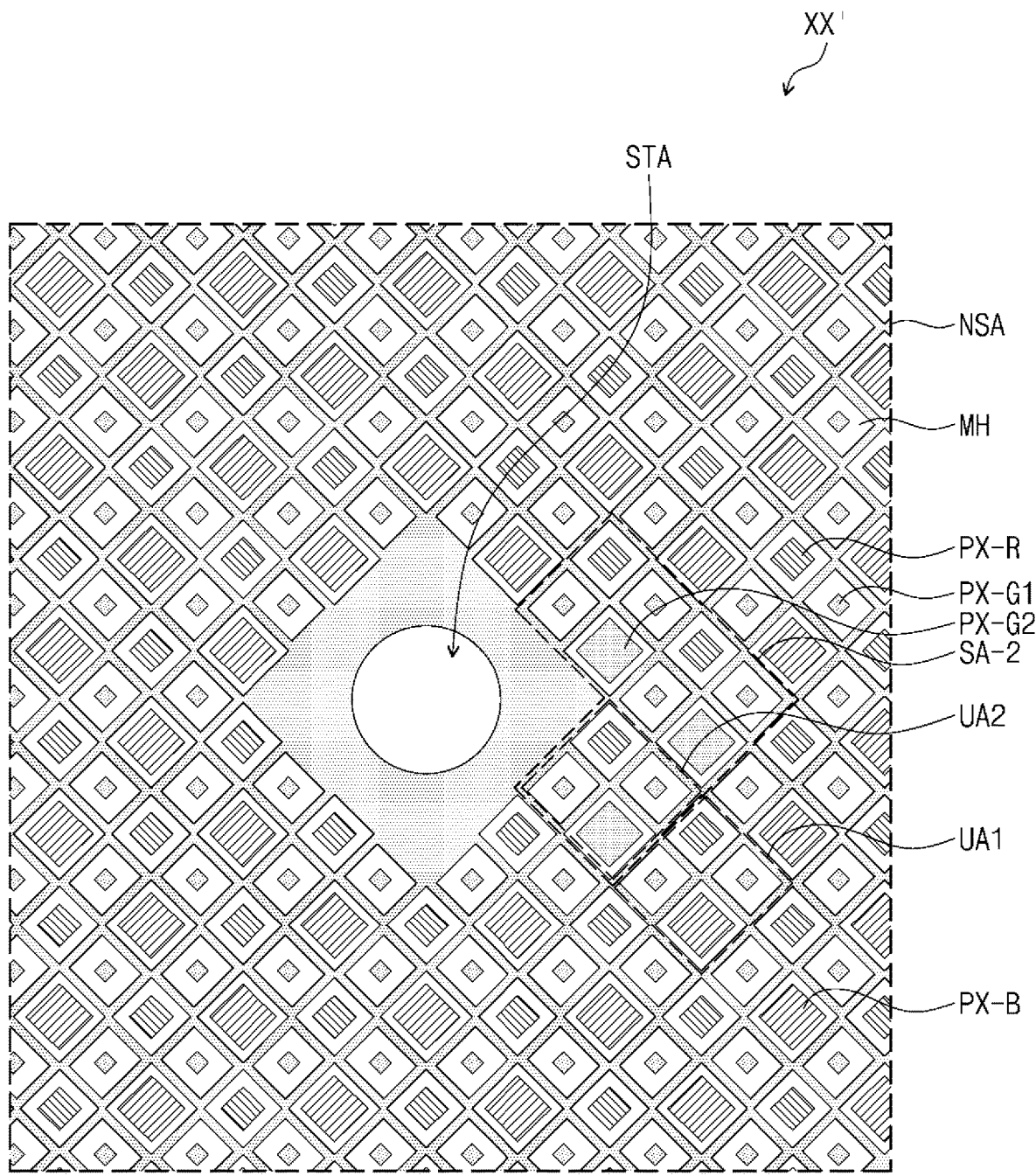
FIGS. 8A to 8B are plan views illustrating a plurality of first and second pixels according to an embodiment of the inventive concept.
Figure 8B:
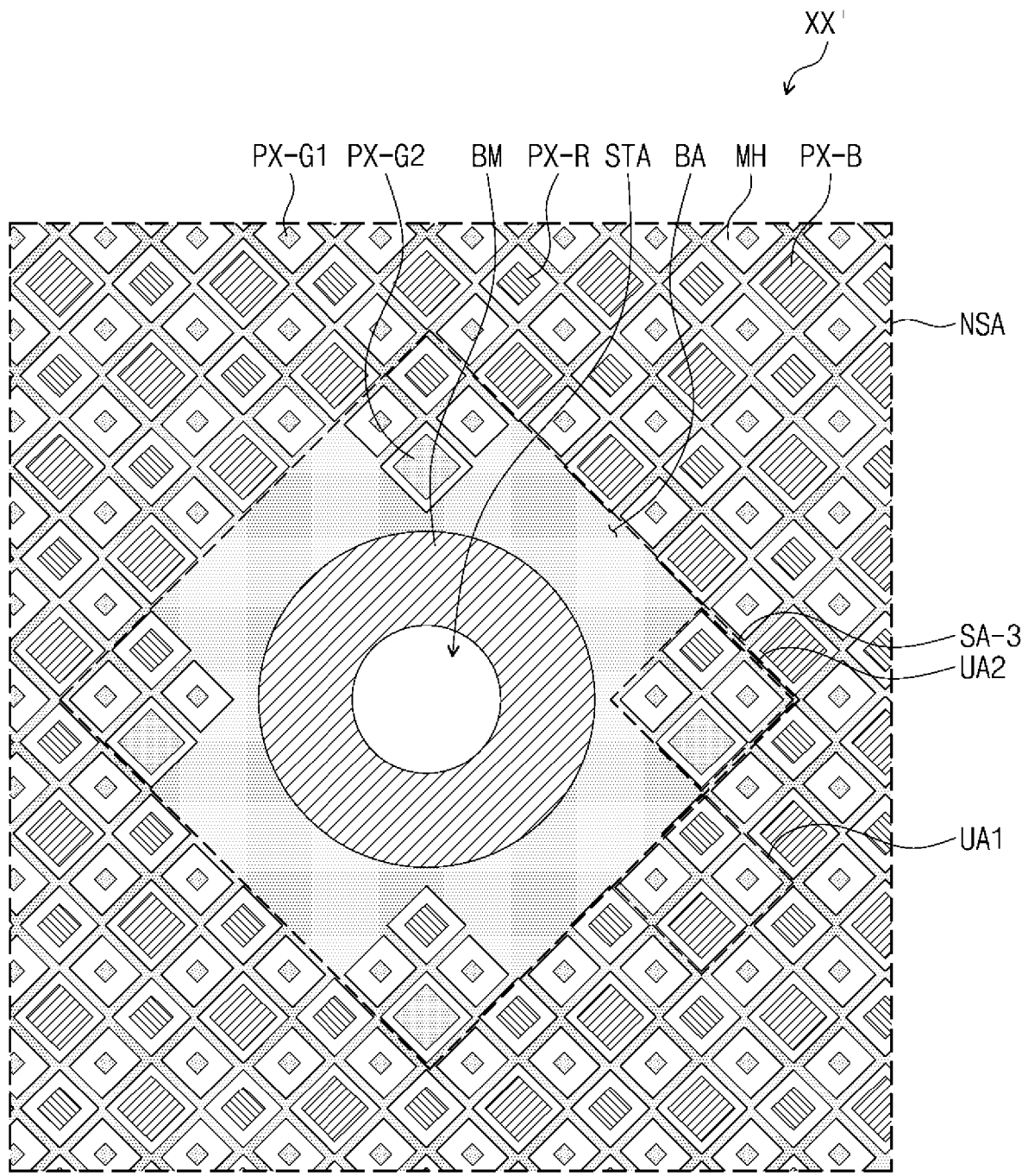
Figure 8B:
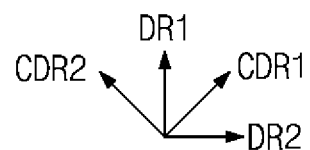

FIGS. 8A to 8B are plan views illustrating a plurality of first and second pixels according to an embodiment of the inventive concept.

As illustrated in FIG. 8A, a peripheral display region SA-2 may be locally disposed at a specific side of the signal transmission region STA. In detail, FIG. 8A illustrates an example, in which the peripheral display region SA-2 provided with the second green and red pixels PX-G1, PX-G2, and PX-R does not enclose the signal transmission region STA and is locally disposed at a partial side of the signal transmission region STA, unlike the peripheral display region SA-1 of FIG. 5. For example, the peripheral display region SA-2 may include three unit regions UA2, in which the second pixels are disposed. In an embodiment, the second pixels may be disposed at one of right, top, and bottom sides of the signal transmission region STA.

As illustrated in FIG. 8B, the display panel 210 may include the light-blocking region BA enclosing the signal transmission region STA. The display panel 210 may include a light-blocking pattern BM provided in the light-blocking region BA. In an embodiment, the light-blocking pattern BM may be disposed in the window 100 and/or the display panel 210. In the case where the display panel 210 includes the light-blocking pattern BM, a size of the light-blocking region BA may be increased, compared with the case that the light-blocking pattern BM is not provided. A peripheral display region SA-3 may be disposed near or around the light-blocking region BA. As illustrated in FIG. 8B, an area of the peripheral display region SA-3 may be reduced by an area of the light-blocking region BA. In an embodiment, when the light-blocking pattern BM is provided, the number of the second pixels may be decreased in proportion to or in accordance with the reduction in size of the peripheral display region SA-3. Although FIG. 8B illustrates an example, in which the number of the second pixels is decreased to ⅓ of FIG. 5, the inventive concept is not limited to this example. For example, even when the size of the light-blocking region BA is increased, there may be no change in the number of the second pixels.

FIGS. 9A to 9D are plan views illustrating a plurality of second pixels provided in a unit region according to an embodiment of the inventive concept. Second pixels may have a red component and a green component. The arrangement of the second pixels in the unit region UA2 is not limited to examples illustrated in FIGS. 9A to 9D and may be variously changed.

Figure 9A:
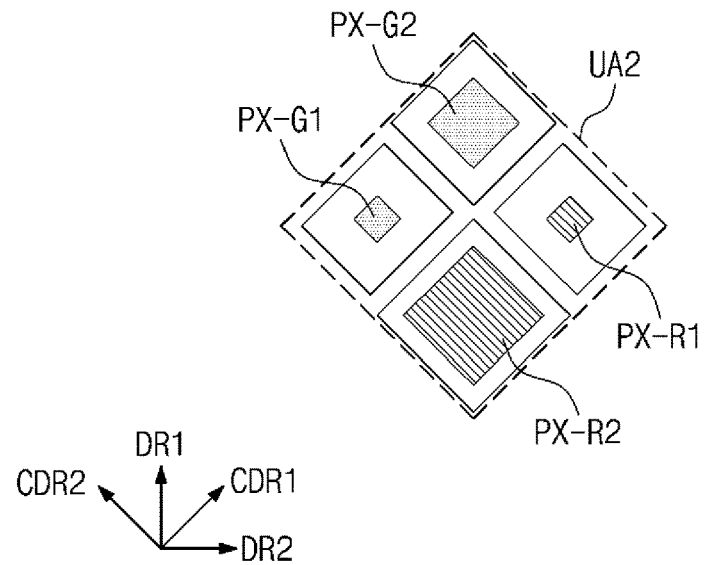
FIGS. 9A, 9B, and 9C, and 9D are plan views illustrating a plurality of second pixels provided in a unit region according to an embodiment of the inventive concept.

Referring to FIG. 9A, in one case of the second pixels, one of the pixels with the first area and the pixel with the second area are the first color pixels PX-G1 and PX-G2 emitting the green light, and the other of the pixels with the first area and the pixel with the third area may be the second color pixels PX-R1 and PX-R2 emitting the red light.

Figure 9B:
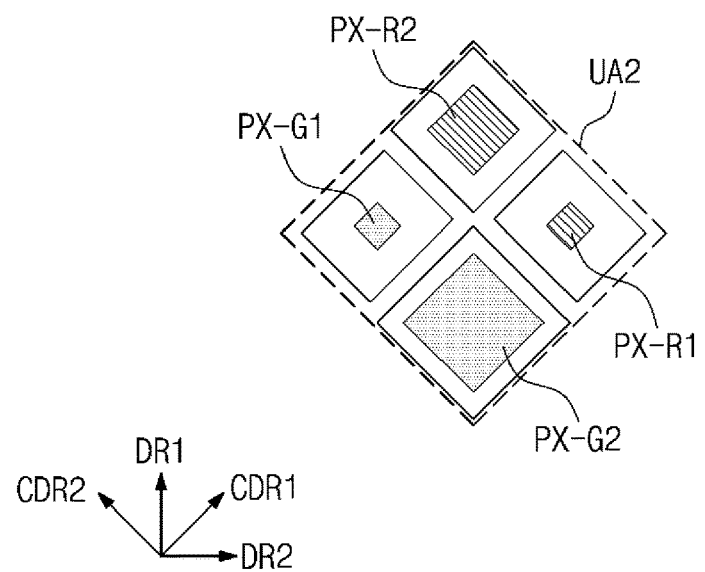

Referring to FIG. 9B, in a case of the second pixels, one of the pixels with the first area PX-G1 and the pixel with the third area PX-G2 may emit the green light, and the other of the pixels with the first area PX-R1 and the pixel with the second area PX-R2 may emit the red light.

Figure 9C:
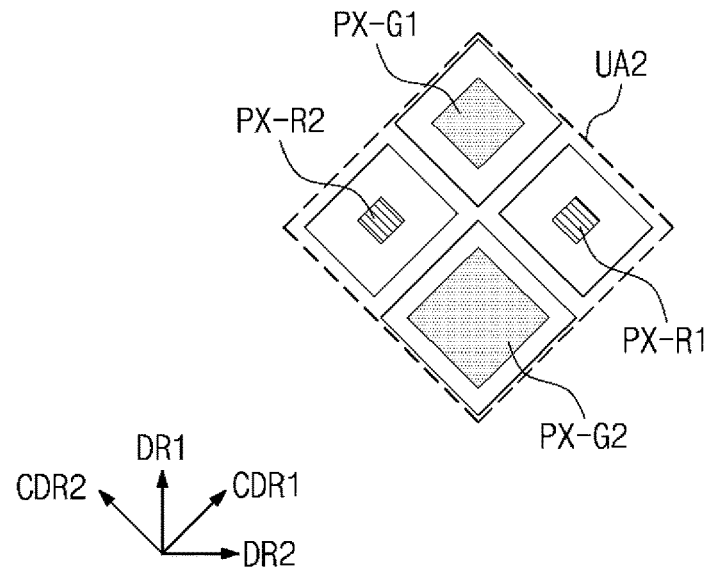

Referring to FIG. 9C, in the case of one variation of the second pixels, two of the pixels with the first area PX-R1 and PX-R2 may emit the red light, a pixel with the second area PX-G1 may emit the green light, and a pixel with the third area PX-G2 may also emit a green light.

Figure 9D:
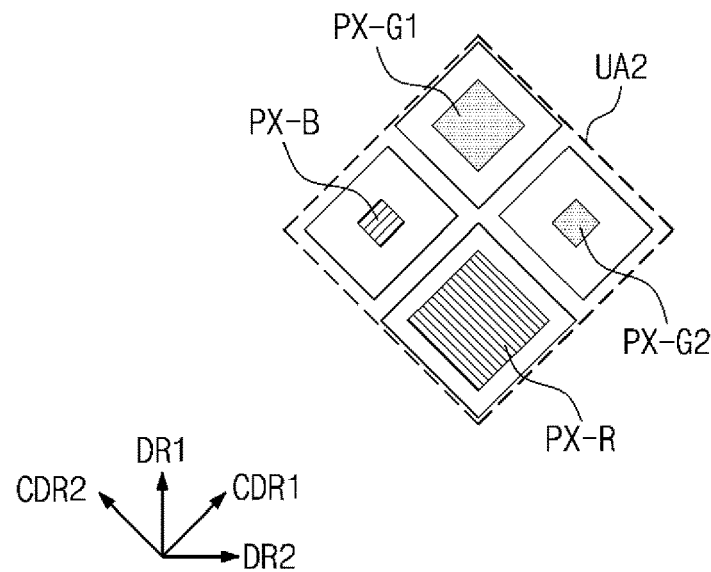

In an embodiment, in the case of the first pixels, the pixels with the first area may emit the green light, the pixel with the second area may emit the red light, and the pixel with the third area may emit the blue light. Referring to FIG. 9D, in another case of the second pixels, one of the pixels with the first area PX-B may emit the blue light, the other of the pixels with the first area PX-G2 and the pixel with the second area PX-G1 may emit the green light, and the pixel with the third area PX-R may emit the red light. That is, even when the third color pixel PX-B emitting the blue light is included in the first pixel, the third color pixel PX-B may correspond to one of the pixels with the first area.

According to an embodiment of the inventive concept, by changing an arrangement of pixels near a front camera module and controlling light amounts of the pixels near the front camera module, it may be possible to effectively measure user's biometric information, without an additional component.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An electronic device, comprising
a display module including a display panel, in which a signal transmission region, a peripheral display region adjacent to the signal transmission region, and a main display region spaced apart from the signal transmission region are provided; and
a camera module overlapped with the signal transmission region,
wherein the display panel comprises a plurality of first pixels, which are disposed in a unit region of the main display region, and a plurality of second pixels, which are disposed in a unit region of the peripheral display region, and
an emission area of green light in the unit region of the first pixels is different from an emission area of green light in the unit region of the second pixels.

2. The electronic device of claim 1, wherein the display module comprises an opening defined in the signal transmission region.

3. The electronic device of claim 1, wherein the emission area of green light in the unit region of the first pixels is smaller than the emission area of green light in the unit region of the second pixels.

4. The electronic device of claim 1, wherein the first pixels comprise first color pixels emitting a green light, second color pixels emitting a red light, and third color pixels emitting a blue light, and
the second pixels comprise the first color pixels and the second color pixels.

5. The electronic device of claim 4, wherein the first pixels comprise two first color pixels, one second color pixel, and one third color pixel, which are disposed in the unit region, and
the second pixels comprises at least two first color pixels and at least one second color pixel, which are disposed in the unit region.

6. The electronic device of claim 4, wherein the second pixels further comprise the third color pixels, and
an emission area of blue light of the first pixels is greater than an emission area of blue light of the second pixels.

7. The electronic device of claim 4, wherein a plurality of the unit regions are provided in the peripheral display region, and
the second pixels in some of the unit regions comprise the third color pixel.

8. The electronic device of claim 7, wherein the number of the some of the unit regions is smaller than half of the number of the unit regions.

9. The electronic device of claim 7, wherein the second pixels in the some of the unit regions comprises two first color pixels, one second color pixel, and one third color pixel.

10. The electronic device of claim 1, wherein each of the first pixels and the second pixels comprises four pixels per the unit region.

11. The electronic device of claim 10, wherein the four pixels comprise two pixels with a first area, one pixel with a second area, and one pixel with a third area,
the first area is smaller than the second area, and
the second area is smaller than the third area.

12. The electronic device of claim 11, wherein, in the case of the first pixels, the pixels with the first area emit the green light, the pixel with the second area emits red light, and the pixel with the third area emits blue light, and
in the case of the second pixels, the pixels with the first area and the pixel with the third area emit the green light, and the pixel with the second area emits the red light.

13. The electronic device of claim 11, wherein, in the case of the second pixels, one of the pixels with the first area and the pixel with the third area emit green light, and the other of the pixels with the first area and the pixel with the second area emit red light.

14. The electronic device of claim 11, wherein, in the case of the second pixels, one of the pixels with the first area and the pixel with the second area emit green light, and the other of the pixels with the first area and the pixel with the third area emit red light.

15. The electronic device of claim 11, wherein, in the case of the first pixels, the pixels with the first area emit the green light, the pixel with the second area emits red light, and the pixel with the third area emits blue light, and in the case of the second pixels, one of the pixels with the first area emits the blue light, the other of the pixels with the first area and the pixel with the second area emit the green light, and the pixel with the third area emits the red light.

16. The electronic device of claim 1, further comprising a control module controlling an emission mode of each of the first and second pixels.

17. The electronic device of claim 16, wherein the control module executes a biometric information measuring mode, when a user's finger is sensed by the camera module.

18. The electronic device of claim 17, wherein the control module executes a high emission mode of emitting a detection light from the first pixels toward the user's finger, if the biometric information measuring mode is executed.

19. The electronic device of claim 18, wherein the camera module senses a light amount of the detection light reflected from the user's finger, and the control module measures biometric information on the user, based on the sensed light amount of the detection light.

\* \* \* \* \*